Nov. 5, 1957 A. J. W. M. VAN OVERBEEK 2,812,390

TRANSISTOR AMPLIFIER CIRCUIT

Filed Aug. 21, 1953

INVENTOR

ADRIANUS JOHANNES WILHELMUS MARIE VAN OVERBEEK

BY [signature]

AGENT 2,812,390
Patented Nov. 5, 1957

2,812,390

TRANSISTOR AMPLIFIER CIRCUIT

Adrianus Johannes Wilhelmus Marie van Overbeek, Eindhoven, Netherlands, assignor, by mesne assignments, to North American Philips Company, Inc., New York, N. Y., a corporation of Delaware Application August 21, 1953, Serial No. 375,715

Claims priority, application Netherlands September 27, 1952

1 Claim. (Cl. 179—171)

The present invention relates to amplifier circuits. More particularly, the invention relates to amplifier circuits for electric input oscillations within a given frequency band employing transistors connected in cascade.

In a known circuit arrangement of this kind the collector electrode of a preceding transistor of the cascade is connected to the input or emitter electrode of the next subsequent transistor through a series resonant circuit tuned to the input frequency so that the collector current of the first mentioned transistor flows substantially entirely to the emitter electrode of the second transistor. The contribution of the first transistor towards the total amplification of the circuit is thus substantially determined by the current amplification factor $\alpha$ of said first transistor.

The invention permits obtaining a materially larger amplification by means of such a circuit. According to the invention, the impedance between the collector electrode of a preceding transistor of the cascade and the emitter electrode of the next subsequent transistor behaves, as far as the input frequency is concerned, like an inductance which, as far as the input frequency is concerned, is in resonance with the capacitor between the collector and the base electrode of the first-mentioned transistor, which capacitor is constituted wholly or in part by stray capacities.

Figure 1:
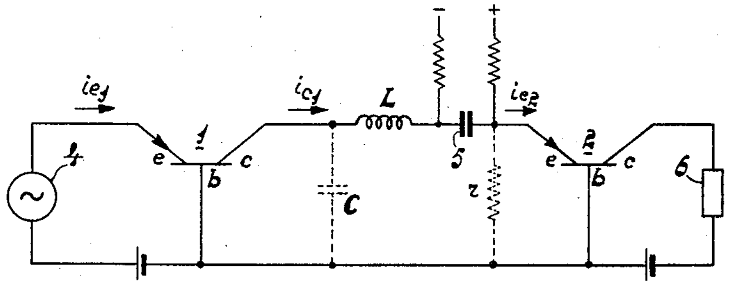
Figure 2:
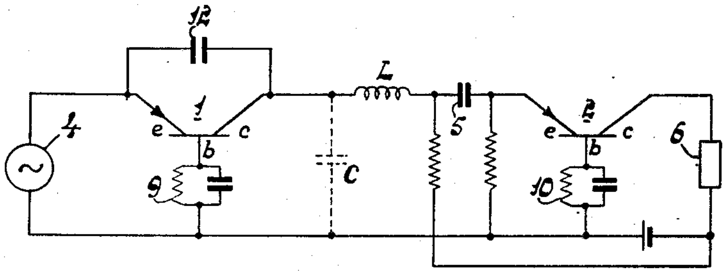

The invention will now be described with reference to the accompanying drawing, in which:

Fig. 1 is a schematic diagram of an embodiment of the amplifier circuit of the present invention; and Fig. 2 is a modification of the embodiment of Fig. 1.

Referring now to Fig. 1, two cascade connected transistors 1 and 2 each comprise an emitter electrode *e*, a collector electrode *c* and a base electrode *b*. A source 4 supplying input oscillations required to be amplified is included in the circuit between the emitter electrode *e* and the base electrode *b* of the first transistor 1 with the result that similar oscillations are set up across the collector electrode *c* of said transistor 1. These oscillations are supplied through a coupling inductance L and a buffer capacitor 5 to the emitter electrode *e* of the second transistor 2 so that the amplified oscillations are set up across a load impedance 6 included in the circuit between the collector electrode *c* and the base electrode *b* of the second transistor 2.

The inductance L of the above-mentioned known circuit arrangement is in series resonance with the capacitor 5 for the input frequency of the source 4. Thus the emitter current $i_{e2}$ of the second transistor 2 becomes substantially equal to the collector current $i_{c1}$ of the first transistor, since the internal input impedance $r$ of the second transistor is negligible as compared with the impedance of the stray collector capacity C of the first transistor. Since the impedance $r$ is also negligible as compared with the internal collector impedance $R_c$ of the first transistor, the amplification of the first transistor is found to be $$\frac{i_{e2}}{i_{e1}}=\left(\frac{i_{c1}}{i_{e1}}\right)_{V_c\sim 0}=\alpha$$

where $V_c$ signifies the voltage across the collector electrode and $\alpha$ the current amplification factor of the first transistor.

According to the invention, in contradistinction thereto 5 designates a buffer capacitor which constitutes a substantially negligible impedance for the signal frequency, and the inductance L together with the stray capacity C of the collector electrode *c* of the first transistor 1 is tuned to the input frquency. Assuming the damping of the resonant circuit L*Cr* to be substantially concentrated in the internal input resistance $r$ of the second transistor 2, the external impedance in the collector circuit of the first transistor is given in the case of resonance by $$\frac{L}{Cr}$$

so that on calculation the collector voltage is found to be $$V_c=\frac{R_m\cdot\frac{L}{C_r}}{R_c+\frac{L}{C_r}}\cdot i_{e1}=\frac{R_mL}{CrR_c+L}\cdot i_{e1}$$

where R*m* designates the mutual impedance of the transistor.

In this case, the current $i_{e2}$ is found to be $$i_{e2}=\frac{V_c}{j\omega L+r}\sim\frac{V_c}{j\omega L}$$

on the assumption that $r<<\omega L$, where $\omega$ is the angular frequency and $j=\sqrt{-1}$, $$\frac{R_m}{R_c}=\alpha \text{ and } \omega L=\frac{1}{\omega C}$$

Consequently, if the amplification $$\frac{i_{e2}}{i_{e1}}$$

of the first transistor 1 is calculated, a value is found which is $$\frac{R_c}{\omega(CrR_c+L)}=\frac{R_c}{\omega CrR_c+\frac{1}{\omega C}}$$

times as great.

Normally in a point contact (A) transistor $R_c$ is some dozens of kilohms and in an NPN transistor some dozens of megohms, whereas $r$ is only some hundreds of ohms and C some few micromicrofarads. Assuming now, for example for a point contact transistor, that $R_c$=20 kilohms, $r$=200 ohms, $C$=5 micromicrofarads and $\omega$=100 megacycles per second, a five-fold gain in amplification is found. For an NPN transistor this gain may even be considerably larger.

The highest amplification is found at that value of the input frequency at which $$\omega=\frac{1}{C\sqrt{R_cr}}$$

This value is determined by differentiating the preceding equation with respect to $\omega$ and equating the differential to zero. At a given input frequency and given values of $R_c$ and $r$ it may therefore be advantageous artificially to increase C by adding a small capacitor.

The circuit shown in Fig. 2 is a modification of the one shown in Fig. 1, the bias voltages of the emitter electrodes *e* of the transistors 1 and 2 being produced in a known manner by means of bypassed base resistors 9 and 10. Like circuit elements are otherwise designated by the same reference numerals as in Fig. 1. If desired, feedback may also be provided by means of a non-bypassed base resistor (not shown) or by intercoupling the collector and the emitter electrode by a capacitance 12. In this case, bearing in mind that the base resistor or internal transistor resistance between the emitter and the base electrode are small as compared with the impedance of the capacitor C, the total capacity as measured between the collector and the base electrode must be taken as the value of the said capacitor.

The circuit has been described with respect to the case of two cascade-connected transistors. Obviously the cascade may be extended to comprise more transistors which may also be intercoupled in the manner according to the invention.

While the invention has been described by means of specific examples and in specific embodiments, I do not wish to be limited thereto, for obvious modifications will occur to those skilled in the art without departing from the spirit and scope of the invention.

What is claimed is:

An amplifier circuit for electric input oscillations having a given frequency spectrum including a given frequency value, comprising first and second transistors each having an emitter, a base, and a collector electrode and an internal input impedance, means for applying said input oscillations to the emitter electrode of said first transistor, and a network interconnecting the collector electrode of said first transistor and the emitter electrode of said second transistor, said network comprising a capacitor shunting the collector and base electrodes of said first transistor, said capacitor having a value substantially determined by the relationship $$\omega = \frac{1}{C\sqrt{R_c r}}$$

wherein $\omega$ is equal to $2\pi$ times the said given frequency value, C is the capacitance of said capacitor, $R_c$ is the internal collector impedance of said first transistor and $r$ is the internal input impedance of said second transistor, an inductance interconnecting the collector electrode of said first transistor and the emitter electrode of said second transistor and said input impedance of said second transistor, said input impedance of said second transistor being of substantially low value relative to the reactance of said inductance, said capacitor and inductance having values producing resonance in said network at the said given frequency value.

References Cited in the file of this patent

UNITED STATES PATENTS

| | | |
|---|---|---|
| 2,229,812 | Maitland | Jan. 28, 1941 |
| 2,527,737 | Jordan | Oct. 31, 1950 |
| 2,556,286 | Meacham | June 12, 1951 |
| 2,581,159 | Achenbach | Jan. 1, 1952 |
| 2,652,460 | Wallace | Sept. 15, 1953 |
| 2,660,624 | Bergson | Nov. 24, 1953 |
| 2,691,074 | Eberhard | Oct. 5, 1954 |

OTHER REFERENCES

Bell Telephone Laboratories, Inc. (Publisher), "The Transistor," Bell Laboratory Text, published December 4, 1951 (particularly pp. 357 and 375).